(12) United States Patent
Knickerbocker

(10) Patent No.: US 8,395,902 B2
(45) Date of Patent: Mar. 12, 2013

(54) MODULAR CHIP STACK AND PACKAGING TECHNOLOGY WITH VOLTAGE SEGMENTATION, REGULATION, INTEGRATED DECOUPLING CAPACITANCE AND COOLING STRUCTURE AND PROCESS

(75) Inventor: John U. Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 12/124,643

(22) Filed: May 21, 2008

(65) Prior Publication Data

US 2009/0290282 A1 Nov. 26, 2009

(51) Int. Cl.
*H05K 1/18* (2006.01)

(52) U.S. Cl. ....... 361/763; 361/53; 361/111; 361/306.1; 361/306.2; 361/306.3; 361/760; 361/762; 361/764; 361/766; 361/782; 361/794; 174/250; 174/256; 174/260; 257/296; 257/532; 257/678; 257/680; 257/686; 257/734; 257/774; 438/106; 438/130; 438/672; 438/770

(58) Field of Classification Search ........... 361/63, 361/56, 111, 306.1, 306.2, 306.3, 760, 762, 361/764, 766, 782, 794; 174/250, 256, 260; 257/296, 532, 678, 680, 686, 734, 774, 96; 438/106, 130, 672, 770
See application file for complete search history.

(56) References Cited

U.S. PATENT DOCUMENTS

| | | | | |
|---|---|---|---|---|
| 4,860,165 A * | 8/1989 | Cassinelli | ............... | 361/710 |
| 5,177,594 A * | 1/1993 | Chance et al. | ............ | 257/678 |
| 6,532,143 B2 * | 3/2003 | Figueroa et al. | ........... | 361/301.4 |
| 6,584,685 B2 * | 7/2003 | Chung et al. | ................. | 29/854 |
| 6,606,237 B1 * | 8/2003 | Naito et al. | ................ | 361/306.3 |
| 6,607,780 B1 * | 8/2003 | Natarajan et al. | .......... | 156/89.12 |
| 6,891,258 B1 * | 5/2005 | Alexander et al. | .......... | 257/678 |
| 6,920,051 B2 * | 7/2005 | Figueroa et al. | ............. | 361/763 |
| 7,123,465 B2 * | 10/2006 | Crane et al. | ................. | 361/306.2 |
| 7,435,627 B2 * | 10/2008 | Horton et al. | ................. | 438/130 |
| 7,486,525 B2 * | 2/2009 | Knickerbocker | ............. | 361/760 |
| 7,488,624 B2 * | 2/2009 | Horton et al. | ................. | 438/130 |
| 7,553,696 B2 * | 6/2009 | Bartley et al. | ................. | 438/107 |
| 7,566,960 B1 * | 7/2009 | Conn | ............................ | 257/686 |
| 7,609,500 B2 * | 10/2009 | Anthony et al. | .............. | 361/111 |
| 7,613,007 B2 * | 11/2009 | Amey et al. | .................... | 361/763 |
| 7,626,828 B1 * | 12/2009 | Alexander et al. | ........... | 361/763 |
| 7,691,669 B2 * | 4/2010 | Horton et al. | ................. | 438/106 |
| 7,705,423 B2 * | 4/2010 | Swaminathan et al. | ....... | 257/532 |
| 7,741,231 B2 * | 6/2010 | Horton et al. | ................. | 438/770 |
| 7,778,038 B2 * | 8/2010 | McGregor et al. | ........... | 361/763 |
| 7,791,168 B2 * | 9/2010 | Horton et al. | ................. | 257/532 |
| 7,791,896 B1 * | 9/2010 | Fan et al. | ....................... | 361/765 |
| 2002/0076919 A1 * | 6/2002 | Peters et al. | ................... | 438/637 |
| 2002/0085334 A1 * | 7/2002 | Figueroa et al. | ........... | 361/301.4 |

(Continued)

*Primary Examiner* — Xiaoliang Chen
(74) *Attorney, Agent, or Firm* — Scully, Scott, Murphy & Presser, P.C.; Anne V. Dougherty, Esq.

(57) ABSTRACT

An electronic apparatus includes an electronic component electrically connected to a substrate positioned beneath the electronic component. A member includes a plurality of decoupling capacitors having different voltages, and the decoupling capacitors are electrically connected to the electronic component. A plurality of voltage planes in the member are electrically connected to the decoupling capacitors. The decoupling capacitors, via the voltage planes in the member, provide different voltages to the voltage planes and thus the electronic component.

12 Claims, 2 Drawing Sheets

U.S. PATENT DOCUMENTS

| | | | |
|---|---|---|---|
| 2002/0170748 A1* | 11/2002 | Larson | 174/260 |
| 2003/0203169 A1* | 10/2003 | Natarajan et al. | 428/209 |
| 2004/0014313 A1* | 1/2004 | Farooq et al. | 438/672 |
| 2004/0170006 A9* | 9/2004 | Sylvester et al. | 361/794 |
| 2005/0141206 A1* | 6/2005 | Radhakrishnan et al. | 361/782 |
| 2005/0207091 A1* | 9/2005 | Kambe et al. | 361/301.1 |
| 2005/0258548 A1* | 11/2005 | Ogawa et al. | 257/778 |
| 2006/0035416 A1* | 2/2006 | Savastiouk et al. | 438/125 |
| 2006/0158828 A1* | 7/2006 | Amey et al. | 361/311 |
| 2007/0035030 A1* | 2/2007 | Horton et al. | 257/773 |
| 2007/0289771 A1* | 12/2007 | Osaka et al. | 174/250 |
| 2008/0111226 A1* | 5/2008 | White et al. | 257/686 |
| 2008/0206960 A1* | 8/2008 | Dang et al. | 438/459 |
| 2008/0217049 A1* | 9/2008 | Dudnikov | 174/260 |
| 2008/0239622 A1* | 10/2008 | Hsu et al. | 361/306.2 |
| 2008/0248596 A1* | 10/2008 | Das et al. | 438/3 |
| 2008/0284037 A1* | 11/2008 | Andry et al. | 257/774 |
| 2009/0014856 A1* | 1/2009 | Knickerbocker | 257/680 |

\* cited by examiner

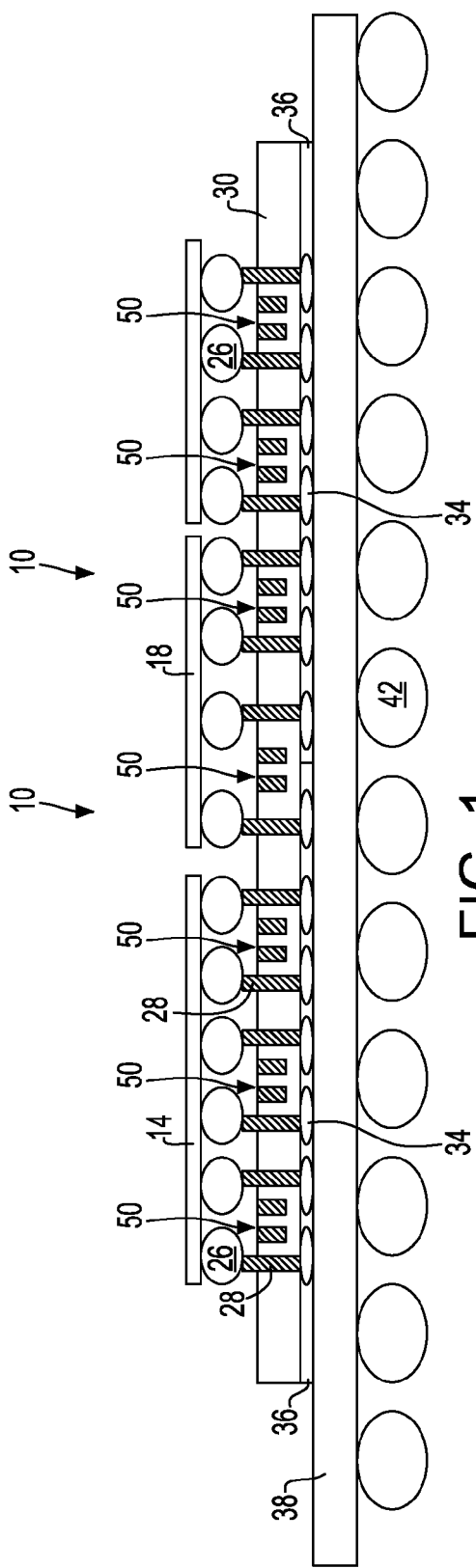
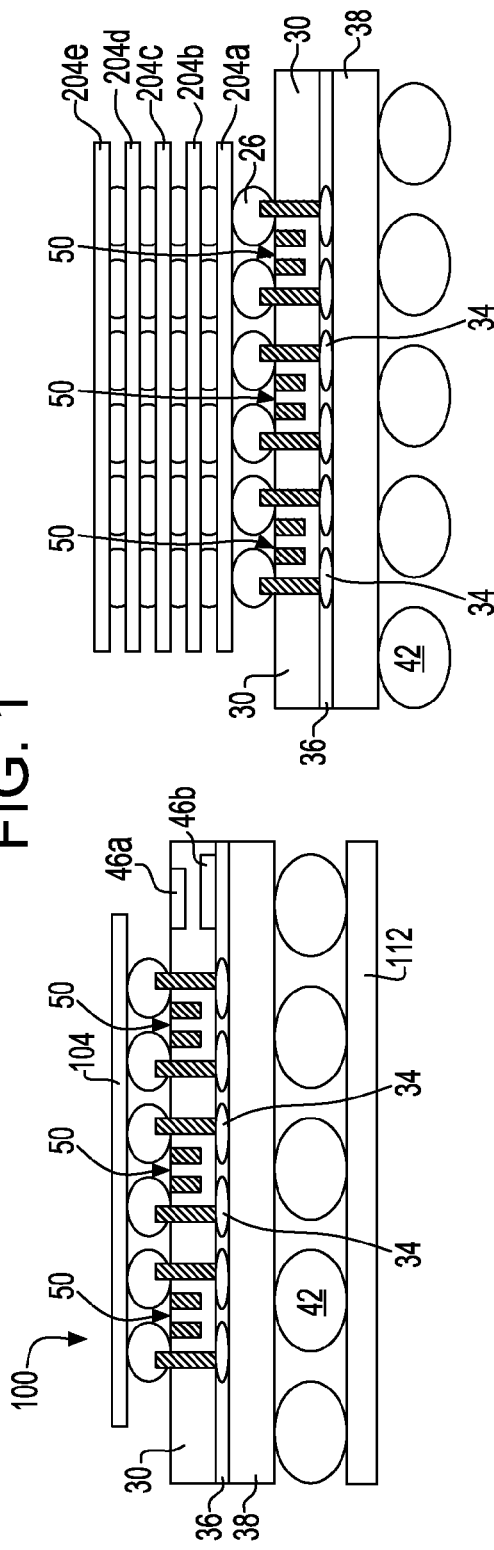
FIG. 1
FIG. 2
FIG. 3

MODULAR CHIP STACK AND PACKAGING TECHNOLOGY WITH VOLTAGE SEGMENTATION, REGULATION, INTEGRATED DECOUPLING CAPACITANCE AND COOLING STRUCTURE AND PROCESS

FIELD OF THE INVENTION

The present invention relates to electronic apparatus with multiple voltage levels, and more specifically, relates to electrical apparatus including decoupling capacitors supporting different on chip voltage levels.

BACKGROUND OF THE INVENTION

Known in the art is chip (integrated circuit (IC)) stacking technology which may include using multiple technology nodes requiring multiple voltages. One way of supplementing current and localized voltage on a chip or within a chip stack is by using on-chip decoupling capacitors (commonly referred to as "decaps") such as deep trench or parallel plate structures. A problem with typical on chip decoupling capacitors is the area (which is expensive real estate) required for any significant decoupling capacitance, as well as the ability to place the capacitance where it is needed, and at the correct voltage for a die with multiple voltage levels versus location and area utilized for active circuits. Off chip decoupling capacitors may be used, however, a problem for off chip decoupling capacitors is that they become less effective the greater the distance they are away from the chip which can be impacted by their effective inductance and the frequency of the chip and circuit simultaneous switching. In addition, when considering a multiple high chip stacking technology, it is difficult to integrate the appropriate, power supply, voltage supply & distribution, with low cost, low inductance decoupling capacitors into a 3D working chip stack. Further, it is difficult to achieve proper integration while also considering integration of power distribution, high bandwidth interconnections, multiple circuits switching simultaneously and voltage variations within tight distributions for proper circuit operations.

It would therefore be desirable to provide or supplement a particular voltage within a 3D chip stack or package and maintain a low inductance capacitor locally and help control the voltage variations within a chip, 3D chip stack or for multiple chips in a package.

SUMMARY OF THE INVENTION

In an aspect of the present invention, an electronic apparatus includes an electronic component electrically connected to a substrate positioned beneath the electronic component. A member including a plurality of decoupling capacitors are segmented to support different voltages on the electronic component, and the decoupling capacitors is electrically connected to the at least one electronic component. The decoupling capacitors may be electrically connected to the electronic component via voltage planes or segmented voltage planes in the member for supporting different voltages on the electronic component to the voltage planes and/or circuits of the electronic component. The electronic component may include a microelectronic device or nanoelectronic device. The apparatus may further include a plurality of electronic components, and the plurality of decoupling capacitors each electrically connected to at least one of the electronic components supporting one or move different voltages to each of the electronic components, respectively. The apparatus may further include a plurality of members each including a plurality of decoupling capacitors electrically connected to at least one of the plurality of electronic components and supporting one or more different voltages to the electronic components, respectively. One of the members may be attached to one of the electronic components. The apparatus may further include a plurality of electronic components electrically communicating with each other and substantially overlapping, and the plurality of decoupling capacitors each electrically connected to at least one of the plurality of electronic components. Further, a plurality of members may be attached to a plurality of the electronic components. Additionally, a plurality of members may include a first member attached to one of the electronic components and a second member being a substrate positioned beneath at least one of the plurality of electronic components. The apparatus may further include a plurality of members wherein one of the members is a silicon package beneath the plurality of electronic components and connected to the substrate via connection elements. The electronic component may includes a semiconductor chip, and the plurality of decoupling capacitors being segmented to support different voltages on the semiconductor chip. Alternatively, the electronic component may include a plurality of chips. Further, wiring connecting one of the components may be redistributed to the substrate. The plurality of electronic components may be electrically connected to a substrate and/or a printed circuit board.

In another aspect of the invention, a system for supplying a specified voltage to an electronic component includes: an electronic component electrically connected to a substrate positioned beneath the electronic component. A member including a plurality of decoupling capacitors having segmentation in order to support different voltages. A plurality of voltage planes or segmentation within voltage planes in the member and the decoupling capacitors being electrically connected to the electronic component via the voltage planes in the member for supporting different voltages to the voltage planes and the electronic component.

In another aspect of the invention, a method for supplying a specified voltage to an electronic component includes: electrically connecting a plurality of electronic components to at least one substrate; electrically connecting a plurality of members to at least one of the plurality of electronic components; providing decoupling capacitors in each of the members, and each of the decoupling capacitors supporting one or more different voltage levels; electrically connecting each of the decoupling capacitors to selected electronic components; and supplying a specified voltage to the electronic components using corresponding decoupling capacitors. The method may further include, supporting or supplying different voltages from the decoupling capacitors to one electronic component using a low inductance path. The method may further include supporting or supplying different voltages from the decoupling capacitors to a plurality of electronic components.

BRIEF DESCRIPTION OF THE DRAWINGS

These and other objects, features and advantages of the present invention will become apparent from the following detailed description of illustrative embodiments thereof which is to be read in connection with the accompanying drawings, in which:

FIG. 1 is a cross sectional side elevational view of a microelectronic structure according to an embodiment of the invention depicting a plurality of chips and etched trenches having decoupling capacitors, and positioned on a single substrate;

FIG. 2 is a cross sectional side elevational view with a break away detail of another embodiment of a microelectronic structure according to the invention depicting a chip, etched trenches having decoupling capacitors, and voltage planes;

FIG. 3 is a cross sectional side elevational view of a microelectronic structure according to another embodiment of the invention having a plurality of chips over a silicon package with solder balls or microbumps therebetween;

DETAILED DESCRIPTION OF THE INVENTION

Figure 4:
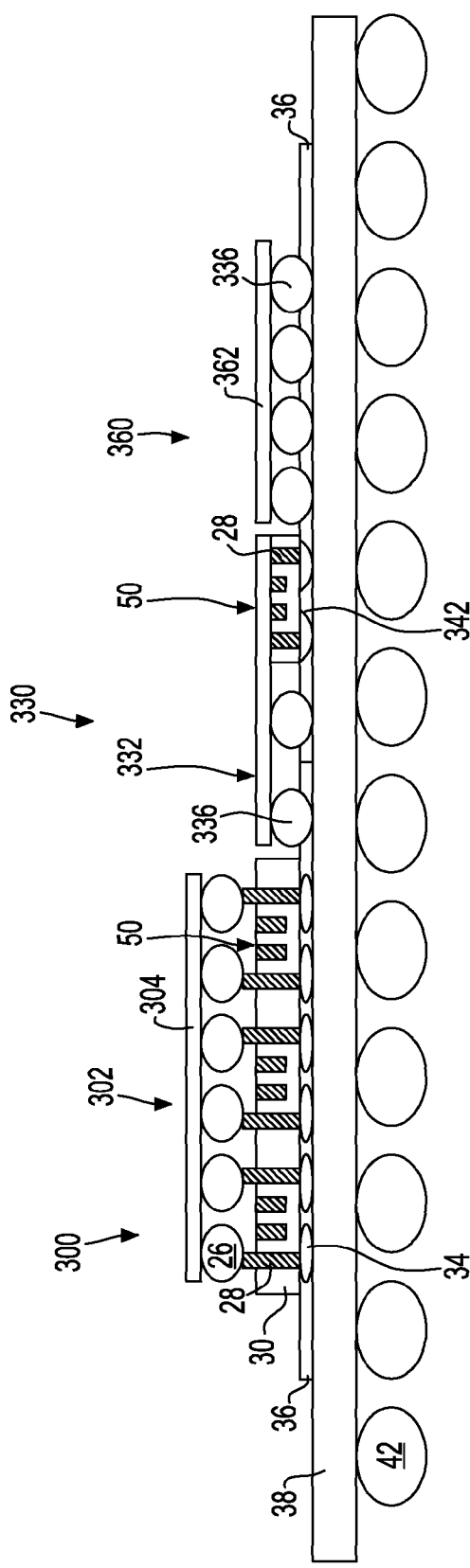
FIG. 4 is a cross sectional side elevational view of another embodiment of the invention depicting several chip configurations on a single substrate and having an embodiment of a decoupling capacitor.

Referring to FIGS. 1-5, wherein like elements have the same reference numerals, an illustrative embodiment of an electronic apparatus, structure, package or microelectronic apparatus 10 according to the invention is shown in FIG. 1. The package 10 includes microelectronic components embodied as chips 14, 18, 22. Each chip 14, 18, 22 is electrically communicating with a member embodied as a silicon (Si) package 30 using solder balls 26 and vias 28. The vias 28 extend through the Si package and connect to connectors 34 in a dielectric layer 36 between the Si package 30 and a substrate 38, and the vias or through-silicon-vias (TSV) 28 electrically connecting to the substrate 38. The vias or TSV's 28 may also provide signal transmission, as well as, power or ground connections and can be electrically insulated from the substrate by use of a dielectric such as $SiO_2$. Other connectors embodied as solder balls 42 are electrically connected to a bottom surface of the substrate 38 and may be connected to a printed circuit board (PCB) 112 (shown in FIG. 2). The Si package 30 includes etched trenches of decoupling capacitors 50 and/or could include parallel plate capacitors (not shown). The decoupling capacitors 50 may have different voltages which are supplied to the chips 14, 18, 22 for the chip's different voltage needs. The decoupling capacitor's 50 voltages are delivered using voltage planes 46 (shown in FIG. 2) and electrical connections (not shown), for example, wiring and/or vias 28. The voltage planes 46 in the Si package are segmented to support multiple voltages and electrically connect with a chip grid (not shown) for providing specified voltages to multiple components.

Referring to FIG. 2, another electronic apparatus embodied as a microelectronic apparatus 100 according to the present invention includes a single microelectronic component embodied as a chip 104. Interconnections such as solder balls 26 are positioned between the chip 104 and the Si package 30 having voltage planes, such as voltage planes 46a and 46b for providing specified voltages to the chip 104. Decoupling capacitors 50 may have different voltages and are connected to different voltage planes, such as voltage planes 46a, 46b, respectively. The interconnections or connectors 34 are positioned in the dielectric layer 36 between the Si package and the substrate 38, and solder balls 42 are electrically connected to the substrate and a printed circuit board (PCB) 112.

Referring to FIG. 3, another embodiment of an electronic apparatus embodied as a microelectronic apparatus 200 according to the present invention includes a plurality of electronic components embodied as chips 204a-204e. Interconnections, or die to die connectors which can be embodied as solder balls or copper (Cu) to Cu interconnections 26 are positioned between the chips 204a-204e for providing electrical connection between the chips 204a-204e. Chip 204a is connected to the Si package 30 using interconnections such as solder balls 26. The Si package 30 includes deep trenches having decoupling capacitors 50, which alternatively may be parallel plate capacitors (not shown). The solder balls 26 are connected by vias or TSV's 28 to interconnections or connectors 34 in the dielectric layer 36.

Referring to FIG. 4, another embodiment of an electronic apparatus embodied as a microelectronic apparatus 300 according to the present invention includes an electronic component embodied as a microelectronic component 302 including a chip 304 electrically connected to a Si package 30 using solder balls 26 and vias or TSV's 28, and is adjacent to chips 332 and 362. The vias or TSV 28 connect to interconnections or connectors 34 positioned in the dielectric layer 36 and are electrically connected to the Si package 30 having solder balls 42 connected to a bottom surface. Another chip 332 is adjacent to the chip 304 and is connected to the substrate 38 using interconnections such as solder balls 336. A member embodied as a Si package 342 is attached to the chip 332 and extends downwardly and across a portion of the length of the chip 332. The Si package 342 includes vias or TSVs 28 and integrated etched trenches having decoupling capacitors 50 and/or parallel plate capacitors (not shown). The decoupling capacitors 50 may support multiple voltages levels to circuit in the chip 332 as well as support required segmentation of voltages to other components of the apparatus 300 using the electrical connections of the vias 28 and the solder balls 336 connected to electrical wires (not shown). Another chip 362 is adjacent to chip 332 and is connected to the substrate 38 using interconnections such as solder balls 336. The chip 362 is not directly attached to a Si package with integrated decoupling capacitors and such as illustrated with interconnections for the other assemblies 302, 330 in the apparatus 300. The chip 362 is supplied power having selected voltages coming from the underlying substrate 38 via wiring and the solder balls 336, as well as, from a PCB 112 (as shown in FIG. 2).

Figure 5:
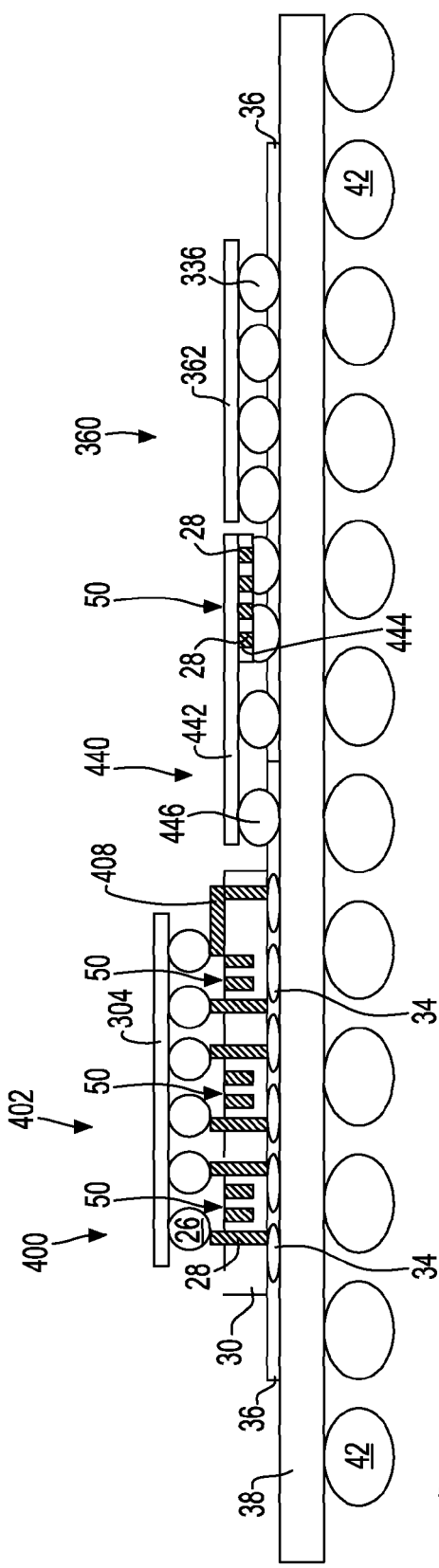
FIG. 5 is a cross sectional side elevational view of another embodiment of the invention depicting several chip configurations on a single substrate having another embodiment of a decoupling capacitor and an embodiment of wiring distribution, vias, sealing elements, solder balls, and multiple seals between the chip and the Si package.

Referring to FIG. 5, another embodiment of an electronic apparatus embodied as a microelectronic apparatus 400 according to the present invention includes electronic components embodied as microelectronic components 402, 440, and 360 (also shown in FIG. 4). Chip 402 includes trenches having decoupling capacitors 50, solder balls 26, vias and/or TSV's 28, and connectors 34 as in the microelectronic component 302 shown in FIG. 4. However, in the component 402 wiring 408 is redistributed to connect with the interconnections or connector pad 34 under the Si package 30. The chip 304 may be of smaller size as shown in FIG. 5 relative to the same chip 304 in FIG. 4, and go on the same package 38 in FIGS. 5 and 4 due to the redistribution provided by package 30 and using redistribution 408 as shown in FIG. 5. The microelectronic apparatus 400 also includes a microelectronic component 440 which includes a chip 442 and a Si package 444 similar to the silicon package 342 shown in FIG. 4. However, the Si package 444 is smaller while still providing vias 28 and trenches having decoupling capacitors 50 as in the Si package 330 shown in FIG. 4. The microelectronic apparatus 400 also includes the microelectronic component 360 also shown in FIG. 4, and similarly is connected to the substrate 38 using solder balls 336. Also, the chip 362 is not directly attached to a Si package including trenches having decoupling capacitors as the other chips 402, 440 in the apparatus 400. The chip 362 is supplied power having selected voltages from the underlying substrate 38 via wiring and interconnections such as the solder balls 336, as well as, from a PCB 112 (as shown in FIG. 2).

Thus, the modular design of the present invention for the die, die stacking and packaging can provide a high level of integrated function while maintaining a methodology which permits use of a smaller size die, integrated packages with decoupling capacitors, testing, high yield, power delivery and cooling between chips in a stack. The modular design according to the present invention provides or supplements a low inductance path for local voltage buses, segmentation, regulation, transformation, and integration of low inductance integrated decoupling capacitors for muticore die, high frequency die operation, and/or multicircuit simultaneous switching depending upon the active and passive function placed into the local circuit and silicon package. Further, the present invention allows for the design of small area and thus low cost silicon passive or active circuits to provide for localized shut down of unused circuits on die while providing the advantage of short distance connections between levels in a chip or chip stack and package design. Additionally, the modular design provides support to multiple voltages to support different circuits at different levels in the chips stack.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. An electronic apparatus, comprising:
   at least a first electronic component electrically connected to at least one substrate positioned beneath the first electronic component;
   at least a second electronic component electrically connected to the substrate positioned beneath the second electronic component;
   at least a first member including a first plurality of decoupling capacitors being segmented to support different voltages on the first electronic component;
   wherein the first plurality of decoupling capacitors are electrically connected to the first electronic component via voltage planes or segmented voltage planes in the first member for supporting different voltages on the first electronic component;
   at least a second member including a second plurality of decoupling capacitors being segmented to support different voltages on the second the electronic component;
   wherein the second plurality of decoupling capacitors are electrically connected to the second electronic component via voltage planes or segmented voltage planes in the second member for supporting different voltages on the second electronic component;
   wherein the first electronic component is physically and electrically coupled to the first member by a first plurality of solder connections; and
   wherein the second electrical component is physically and electrically coupled to the substrate by a second plurality of solder connections and wherein the second member is electrically connected to the second electronic component without use of any solder connections.

2. The apparatus of claim 1, wherein at least one of the first and second electronic components includes a microelectronic device or nanoelectronic device.

3. The apparatus of claim 1, further comprising at least a third electronic component, wherein the first and third electronic components are configured to electrically communicate with each other and wherein the first and third electronic components substantially overlap in stacked relation to each other.

4. The apparatus of claim 1, wherein at least one of the first and second members is a silicon package.

5. The apparatus of claim 1, wherein at least one of the first and second electronic components includes a semiconductor chip.

6. The apparatus of claim 1, wherein at least one of the first and second electronic components includes a plurality of chips.

7. The apparatus of claim 1, wherein wiring connecting one of the first and second electronic components is redistributed to the substrate.

8. The apparatus of claim 1, wherein the first and second electronic components are electrically connected to a substrate and/or a printed circuit board.

9. The apparatus of claim 1, wherein each of the first and second plurality of solder connections comprises a plurality of solder balls.

10. The apparatus of claim 1, wherein the electronic apparatus includes a device as the first electronic component which defines a device side of the electronic apparatus, and the substrate defines a substrate side of the apparatus.

11. The apparatus of claim 1, wherein each of the first and second plurality of decoupling capacitors are deep trench capacitors.

12. The apparatus of claim 1, wherein the second member is angularly extending from the second electrical component.

* * * * *